(12) United States Patent
Yuan

(10) Patent No.: US 11,618,970 B2
(45) Date of Patent: Apr. 4, 2023

(54) NANO-WIRE GROWTH

(71) Applicant: SILCOTEK CORP., Bellefonte, PA (US)

(72) Inventor: Min Yuan, State College, PA (US)

(73) Assignee: Silcotek Corp., Bellefonte, PA (US)

(*) Notice: Subject to any disclaimer, the term of this patent is extended or adjusted under 35 U.S.C. 154(b) by 188 days.

(21) Appl. No.: 17/115,238

(22) Filed: Dec. 8, 2020

(65) Prior Publication Data

US 2021/0087708 A1 Mar. 25, 2021

Related U.S. Application Data

(63) Continuation-in-part of application No. PCT/US2020/037489, filed on Jun. 12, 2020.

(60) Provisional application No. 62/861,403, filed on Jun. 14, 2019.

(51) Int. Cl.
| | |
|---|---|
| C30B 29/62 | (2006.01) |
| C01B 33/04 | (2006.01) |
| C30B 25/18 | (2006.01) |
| C30B 29/12 | (2006.01) |
| C30B 33/00 | (2006.01) |
| B82Y 30/00 | (2011.01) |
| B82Y 40/00 | (2011.01) |

(52) U.S. Cl.
CPC ............ *C30B 29/62* (2013.01); *C01B 33/043* (2013.01); *C30B 25/18* (2013.01); *C30B 29/12* (2013.01); *C30B 33/005* (2013.01); *B82Y 30/00* (2013.01); *B82Y 40/00* (2013.01); *C01P 2004/16* (2013.01)

(58) Field of Classification Search
CPC combination set(s) only.
See application file for complete search history.

(56) References Cited

U.S. PATENT DOCUMENTS

| | | |
|---|---|---|
| 4,173,661 A | 11/1979 | Bourdon |
| 4,402,997 A | 9/1983 | Hogan et al. |
| 4,560,589 A | 12/1985 | Endou et al. |
| 4,579,752 A | 4/1986 | Dubois et al. |

(Continued)

FOREIGN PATENT DOCUMENTS

| | | |
|---|---|---|
| CN | 100347834 | 11/2007 |
| CN | 104294236 A | 1/2015 |

(Continued)

OTHER PUBLICATIONS

Aoyagi et al "Growth mechanisms for atypical forms of silicon nanowires" Metal Materials International vol. 19 No. 1 2013 pares 87-92.*

(Continued)

*Primary Examiner* — Robert M Kunemund
(74) *Attorney, Agent, or Firm* — Saxton & Stump, LLC

(57) ABSTRACT

Nano-wire growth processes, nano-wires, and articles having nano-wires are disclosed. The nano-wire growth process includes trapping growth-inducing particles on a substrate, positioning the substrate within a chamber, closing the chamber, applying a vacuum to the chamber, introducing a precursor gas to the chamber, and thermally decomposing the precursor gas. The thermally decomposing of the precursor gas grows nano-wires from the growth-inducing particles. The nano-wires and the articles having the nano-wires are produced by the nano-wire growth process.

3 Claims, 6 Drawing Sheets

(56) References Cited

U.S. PATENT DOCUMENTS

| | | |
|---|---|---|
| 4,671,997 A | 6/1987 | Galasso et al. |
| 4,684,542 A | 8/1987 | Jasinski et al. |
| 4,714,632 A | 12/1987 | Cabrera et al. |
| 4,720,395 A | 1/1988 | Foster |
| 4,741,964 A | 5/1988 | Haller |
| 4,749,631 A | 6/1988 | Haluska et al. |
| 4,753,856 A | 6/1988 | Haluska et al. |
| 4,792,460 A | 12/1988 | Chu et al. |
| 4,842,888 A | 6/1989 | Haluska et al. |
| 4,956,204 A | 9/1990 | Amazawa et al. |
| 5,128,515 A | 7/1992 | Tanaka |
| 5,141,567 A | 8/1992 | Tahara |
| 5,160,544 A | 11/1992 | Garg et al. |
| 5,208,069 A | 5/1993 | Clark et al. |
| 5,249,554 A | 10/1993 | Tamor et al. |
| 5,250,451 A | 10/1993 | Chouan |
| 5,270,082 A | 12/1993 | Lin et al. |
| 5,299,731 A | 4/1994 | Liyanage et al. |
| 5,413,813 A | 5/1995 | Cruse et al. |
| 5,474,613 A | 12/1995 | Pickering et al. |
| 5,480,677 A | 1/1996 | Li et al. |
| 5,481,135 A | 1/1996 | Chandra et al. |
| 5,510,146 A | 4/1996 | Miyasaki |
| 5,562,952 A | 10/1996 | Nakahigashi et al. |
| 5,563,102 A | 10/1996 | Michael |
| 5,756,404 A | 5/1998 | Friedenreich et al. |
| 5,818,071 A | 10/1998 | Loboda et al. |
| 5,825,078 A | 10/1998 | Michael |
| 5,874,368 A | 2/1999 | Laxman et al. |
| 5,939,333 A | 8/1999 | Hurley et al. |
| 5,981,403 A | 11/1999 | Ma et al. |
| 5,994,675 A | 11/1999 | Bethune et al. |
| 5,997,742 A | 12/1999 | Gjerde et al. |
| 6,157,003 A | 12/2000 | Drimer |
| 6,159,871 A | 12/2000 | Loboda et al. |
| 6,312,808 B1 | 11/2001 | Veerasamy et al. |
| 6,319,556 B1 | 11/2001 | Olsen et al. |
| 6,337,459 B1 | 1/2002 | Terwijn et al. |
| 6,416,577 B1 | 7/2002 | Suntoloa et al. |
| 6,416,816 B2 | 7/2002 | Veerasamy et al. |
| 6,444,268 B2 | 9/2002 | Lefcowitz et al. |
| 6,444,326 B1 | 9/2002 | Smith |
| 6,472,076 B1 | 10/2002 | Hacker |
| 6,511,760 B1 | 1/2003 | Barone et al. |
| 6,531,182 B2 | 3/2003 | Veerasamy et al. |
| 6,531,398 B1 | 3/2003 | Gaillard et al. |
| 6,531,415 B1 | 3/2003 | Yang et al. |
| 6,566,281 B1 | 5/2003 | Buchanan et al. |
| 6,592,993 B2 | 7/2003 | Veerasamy et al. |
| 6,593,655 B1 | 7/2003 | Loboda et al. |
| 6,630,413 B2 | 10/2003 | Todd |
| 6,765,178 B2 | 7/2004 | Shang et al. |
| 6,998,579 B2 | 2/2006 | Inagawa et al. |
| 7,022,948 B2 | 4/2006 | Shang et al. |
| 7,070,833 B2 | 7/2006 | Smith et al. |
| 7,192,626 B2 | 3/2007 | Dussarrat et al. |
| 7,429,717 B2 | 9/2008 | Yudovsky |
| 7,510,935 B2 | 3/2009 | Lee et al. |
| 7,560,366 B1 | 7/2009 | Romano et al. |
| 7,560,368 B2 * | 7/2009 | Magri' .............. H01L 29/66712 438/570 |
| 7,860,379 B2 | 12/2010 | Hunter et al. |
| 7,867,627 B2 | 1/2011 | Smith et al. |
| 7,875,556 B2 | 1/2011 | Xiao et al. |
| 8,092,770 B2 | 1/2012 | Betz et al. |
| 8,286,571 B2 | 10/2012 | Driver et al. |
| 8,357,430 B2 | 1/2013 | Dussarrat et al. |
| D689,107 S | 9/2013 | Grove |
| 8,552,346 B2 | 10/2013 | Ambal et al. |
| 8,563,445 B2 | 10/2013 | Liang et al. |
| D713,024 S | 9/2014 | Grove et al. |
| 8,822,018 B2 | 9/2014 | Thoumazet et al. |
| 8,980,382 B2 | 3/2015 | Ingle et al. |
| 9,340,880 B2 | 5/2016 | Mattzela |
| 9,777,368 B2 | 10/2017 | Smith et al. |
| 9,915,001 B2 | 3/2018 | Yuan et al. |
| 9,975,143 B2 | 5/2018 | Smith et al. |
| 10,087,521 B2 | 10/2018 | Yuan et al. |
| 10,316,408 B2 | 6/2019 | Smith et al. |
| 10,323,321 B1 | 6/2019 | Yuan et al. |
| 10,487,402 B2 | 11/2019 | Yuan et al. |
| 10,487,403 B2 | 11/2019 | Smith |
| 10,604,660 B2 | 3/2020 | Smith et al. |
| 2001/0049203 A1 | 12/2001 | Kim et al. |
| 2001/0055672 A1 | 12/2001 | Todd |
| 2002/0045009 A1 | 4/2002 | Tobaski et al. |
| 2003/0152701 A1 | 8/2003 | Kang et al. |
| 2003/0186000 A1 | 10/2003 | Li et al. |
| 2004/0037956 A1 | 2/2004 | Yang |
| 2004/0175579 A1 | 9/2004 | Smith et al. |
| 2005/0064684 A1 | 3/2005 | Todd et al. |
| 2005/0100670 A1 | 5/2005 | Dussarrat et al. |
| 2005/0183663 A1 | 8/2005 | Cheng et al. |
| 2005/0271893 A1 | 12/2005 | Kobrin et al. |
| 2006/0216952 A1 | 9/2006 | Bhanap et al. |
| 2007/0042118 A1 | 2/2007 | Yoo |
| 2007/0243317 A1 | 10/2007 | DuBois et al. |
| 2007/0281448 A1 | 12/2007 | Chen et al. |
| 2009/0078202 A1 | 3/2009 | Strikovski et al. |
| 2009/0230558 A1 | 9/2009 | Matsuoka |
| 2010/0248496 A1 | 9/2010 | Wei et al. |
| 2011/0259879 A1 | 10/2011 | Hanawa et al. |
| 2011/0305784 A1 | 12/2011 | Lee |
| 2012/0045954 A1 | 2/2012 | Bleecher et al. |
| 2012/0219727 A1 | 8/2012 | Gandhiraman et al. |
| 2012/0251797 A1 | 10/2012 | Smith et al. |
| 2013/0244025 A1 | 9/2013 | Smith et al. |
| 2014/0256156 A1 | 9/2014 | Harada et al. |
| 2014/0370300 A1 | 12/2014 | Smith |
| 2015/0024152 A1 | 1/2015 | Carr et al. |
| 2015/0030885 A1 | 1/2015 | Smith |
| 2015/0206795 A1 | 7/2015 | Hasebe et al. |
| 2015/0283307 A1 | 10/2015 | Smith et al. |
| 2015/0371991 A1 | 12/2015 | Nobuto |
| 2016/0049309 A1 | 2/2016 | Tapily et al. |
| 2016/0354758 A1 | 12/2016 | Gorecki et al. |
| 2018/0258529 A1 * | 9/2018 | Vezza .................... C23C 16/24 |
| 2018/0318742 A1 | 11/2018 | Bevis |
| 2019/0003044 A1 | 1/2019 | Yuan |
| 2019/0086371 A1 | 3/2019 | Lauber et al. |

FOREIGN PATENT DOCUMENTS

| | | |
|---|---|---|
| DE | 2523257 | 12/1976 |
| DE | 2829568 | 1/1980 |
| EP | 0911307 A1 | 4/1999 |
| EP | 1150345 A2 | 4/2001 |
| EP | 0996767 B1 | 9/2003 |
| EP | 1790757 A1 | 5/2007 |
| EP | 1988190 A2 | 11/2008 |
| EP | 2015/054687 * | 4/2015 |
| GB | 2395492 A | 5/2004 |
| JP | 2012138627 A | 7/2012 |
| JP | 2013227628 A | 11/2013 |
| WO | 9902757 A1 | 1/1999 |
| WO | 0136190 A1 | 5/2001 |
| WO | 2009032488 A1 | 3/2009 |
| WO | 2009143618 A1 | 12/2009 |
| WO | 2010125926 A1 | 4/2010 |
| WO | 2010079299 A1 | 7/2010 |
| WO | 2011056550 A1 | 5/2011 |
| WO | 2012047945 A2 | 4/2012 |
| WO | 2015054687 A1 | 4/2015 |

OTHER PUBLICATIONS

Nimrod Harpak et al. "Large-Scale Self-Catalyzed Spongelike Silicon Nano-Network-Based 3D Anodes for High-Capacity Lithium-Ion Batteries" Nano Letters, vol. 19, No. 3, Mar. 13, 2019 (Mar. 13, 2019), pp. 1944-1954.

(56) References Cited

OTHER PUBLICATIONS

Jeong-Hyun Cho et al. "The effect of metal silicide formation on silicon nanowire-based lithium-ion battery anode capacity" Journal of Power Sources, vol. 205, Jan. 1, 2012 (Jan. 1, 2012), pp. 467-473.

* cited by examiner

US 11,618,970 B2

NANO-WIRE GROWTH

PRIORITY

The present application is a non-provisional patent application claiming priority to and benefit of International Application PCT/US2020/037489, titled "NANO-WIRE GROWTH", filed Jun. 12, 2020, which claims priority and benefit of U.S. Provisional Patent Application No. 62/861,403, filed Jun. 14, 2019, and titled "NANO-WIRE GROWTH," the entirety of which is incorporated by reference.

FIELD OF THE INVENTION

The present invention is directed to nano-wire growth and systems and components utilizing the nano-wires formed. More particularly, the present invention is directed to nano-wire growth induced during a thermal treatment and systems and components utilizing nano-wires formed from the thermal treatment.

BACKGROUND OF THE INVENTION

Nano-wire growth has become an area of interest for a variety of industries. Commercially-reasonable and cost-effective techniques for achieving nano-wire growth are desired.

U.S. Pat. No. 6,444,326, titled "Surface Modification of Solid Supports through the Thermal Decomposition and Functionalization of Silanes," which is hereby incorporated by reference in its entirety, discloses chemical vapor deposition techniques. Such techniques provide commercially-reasonable and cost-effective techniques for applying coatings to substrates, but do not disclose nano-wire growth techniques.

Nano-wire growth induced during a thermal treatment that shows one or more improvements in comparison to the prior art would be desirable in the art.

BRIEF DESCRIPTION OF THE INVENTION

In an embodiment, a nano-wire growth process includes trapping growth-inducing particles on a substrate, positioning the substrate within a chamber, closing the chamber, applying a vacuum to the chamber, introducing a precursor gas to the chamber, and thermally decomposing the precursor gas. The thermally decomposing of the precursor gas grows nano-wires from the growth-inducing particles.

In another embodiment, a nano-wire is produced by trapping a growth-inducing particle on a substrate, positioning the substrate within a chamber, closing the chamber, applying a vacuum to the chamber, introducing a precursor gas to the chamber, and thermally decomposing the precursor gas.

In another embodiment, articles, components and systems having nano-wires produced by trapping growth-inducing particles on a substrate, positioning the substrate within a chamber, closing the chamber, applying a vacuum to the chamber, introducing a precursor gas to the chamber, and thermally decomposing the precursor gas.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided are nano-wire growth techniques, articles having nano-wire growth, and nano-wire growth. Embodiments of the present disclosure, for example, in comparison to concepts failing to include one or more of the features disclosed herein, permit nano-wire growth in a wide range of geometries (for example, within narrow channels/tubes, three-dimensionally complex geometries, and/or hidden or non-line-of-site geometries, such as, in needles, tubes, probes, fixtures, complex planar and/or non-planar geometry articles, simple non-planar and/or planar geometry articles, and combinations thereof), permit nano-wire growth in a bulk of articles, are capable of being used in or replacing components that are used in industries traditionally believed to be too sensitive for processes that are not flow-through processes (for example, based upon compositional purity, presence of contaminants, thickness uniformity, and/or amount of gas phase nucleation embedded within), allow materials to be used as a substrate that would otherwise produce an electrical arc in a plasma environment, or permit a combination thereof.

Figure 1:
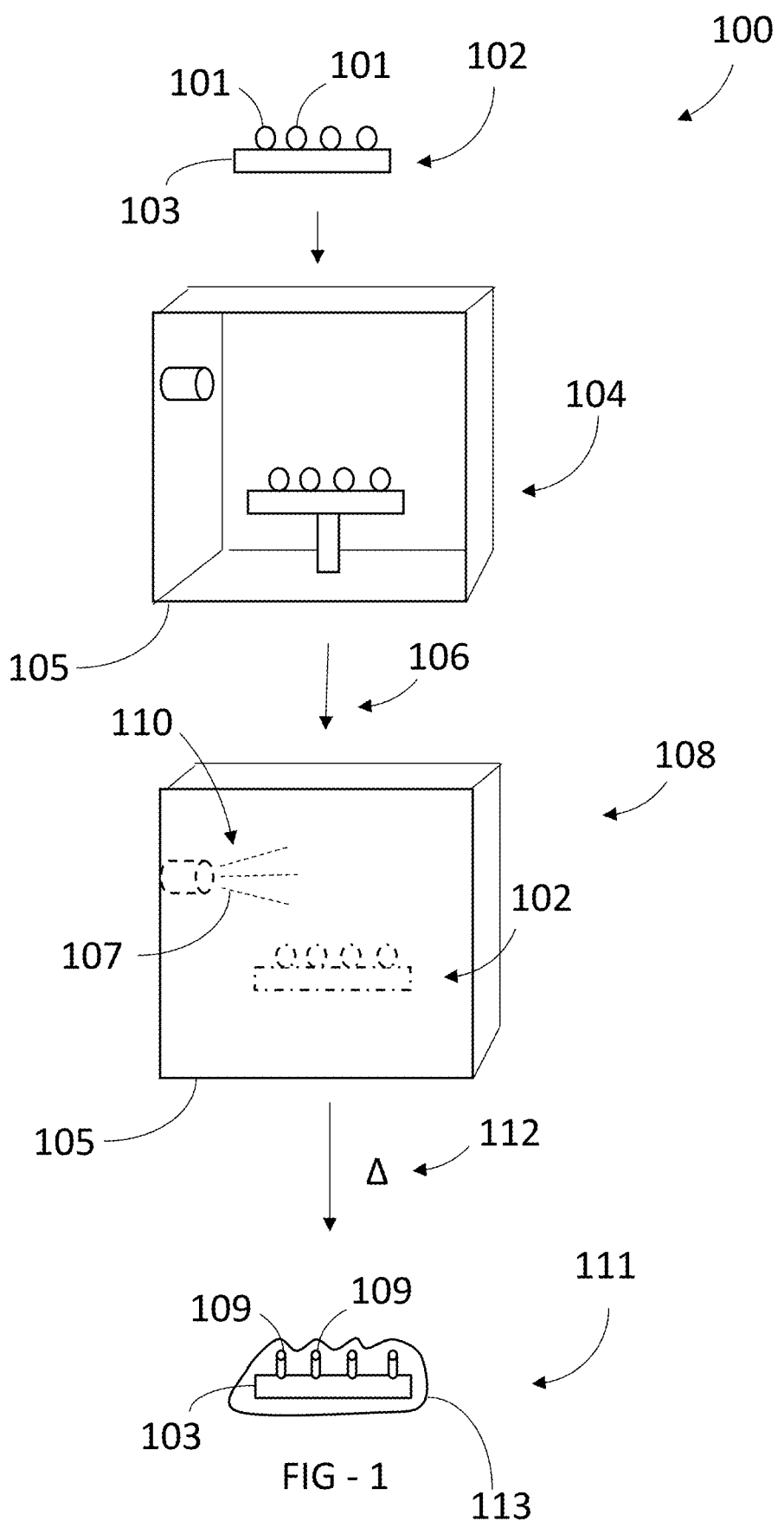
FIG. 1 is an embodiment of a process of producing nano-wire growth, according to an embodiment of the disclosure.

Referring to FIG. 1, according to an embodiment, a nano-wire growth process 100 includes trapping growth-inducing particles 101 in or on a substrate 103 (step 102), positioning the substrate 103 within a chamber 105 (step 104), closing the chamber 105 (step 106), applying a vacuum to the chamber 105 (step 108), introducing a precursor gas 107 to the chamber 105 (step 110), and thermally decomposing the precursor gas 107 (step 112), for example, with the precursor gas 107 having a flow rate of 0 standard cubic centimeters per minute (SCCM). The thermally decomposing of the precursor gas 107 grows or begins the growth of nano-wires 109 from the growth-inducing particles 101. In further embodiments, the nano-wire growth process 100 includes functionalizing or oxidizing.

As used here, the term "nano-wire" is intended to encompass wires, whiskers, fibers, capsules, particles, filaments, rods, or the like. Dimensions of such nano-wires are capable of being on the order of the diameter (or other width) dimension being between 1 nm and 500 nm, 1 nm and 100 nm, 10 nm and 50 nm 50 nm and 200 nm, 100 nm and 400 nm, or any suitable combination, sub combination, range, or sub-range therein. Maximum dimensions are capable of being between 1 nm and 100 microns, 100 nm and 10 microns 500 nm and 1 micron, or any suitable combination, sub combination, range, or sub-range therein.

The trapping of the growth-inducing particles 101 in or on a substrate 103 (step 102) is by manually positioning, robotically positioning, abrasively positioning, electrostatically positioning, or otherwise depositing of the growth-inducing particles 101 on the substrate 103. Suitable different materials of the growth-inducing particles 101 include, but are not limited to, brass, Monel®, silicate, and copper. Alternatively, the nano-wires 109 are produced on select surfaces, for example, in the direction of abrasive processes, such as rubbing, using a different material from the substrate. In further embodiments, the growth-inducing particles 101 are susceptible to external stimuli (for example, magnets, fields, thermal gradients, etc.) that allow the arrangement of the growth to be in a single orientation (in addition to or independent of a pattern corresponding to the trapping (step 102)).

The positioning the substrate 103 within a chamber 105 (step 104) is manually, robotically, within a plurality of fixtures, or through any known techniques suitable for chemical vapor deposition.

The chemical vapor deposition process 100 includes positioning an uncoated article 103 (or a plurality of the uncoated articles 103) having the substrate 103 within an enclosed chamber 105. In one embodiment, the positioning is manually with the uncoated articles being arranged generally horizontally ("generally" being within a 1 degree, 5 degrees, 10 degrees, or 15 degrees) or otherwise inconsistent with the direction of gravity. In another embodiment, the positioning is manually with the uncoated articles 103 being arranged in a vertical (stacked) orientation separated by supports (and thus obstructed from line-of-sight), arranged laterally or perpendicular to gravity (for example, with all or most openings being generally perpendicular to gravity, "generally" being within a 1 degree, 5 degrees, 10 degrees, or 15 degrees), arranged in an overlapping manner that reduces the amount of volume available for gas phase nucleation, positioned in a fixture corresponding with the geometry of the articles, or a combination thereof.

The chamber 105 (or vessel) has any dimensions or geometry that allows suitable temperature and the pressures to permit the applying of the vacuum (step 108). In one embodiment, the dimensions for the enclosed vessel include, but are not limited to, having a minimum width of greater than 5 cm, greater than 10 cm, greater than 20 cm, greater than 30 cm, greater than 100 cm, greater than 300 cm, greater than 1,000 cm, between 10 cm and 100 cm, between 100 cm and 300 cm, between 100 cm and 1,000 cm, between 300 cm and 1,000 cm, any other minimum width capable of uniform or substantially uniform heating, or any suitable combination, sub-combination, range, or sub-range therein. Suitable volumes for the enclosed vessel include, but are not limited to, at least 1,000 $cm^3$, greater than 3,000 $cm^3$, greater than 5,000 $cm^3$, greater than 10,000 $cm^3$, greater than 20,000 $cm^3$, between 3,000 $cm^3$ and 5,000 $cm^3$, between 5,000 $cm^3$ and 10,000 $cm^3$, between 5,000 $cm^3$ and 20,000 $cm^3$, between 10,000 $cm^3$ and 20,000 $cm^3$, any other volumes capable of uniform or substantially uniform heating, or any suitable combination, sub-combination, range, or sub-range therein.

The introducing of the precursor gas 107 to the chamber 105 (step 110), or alternatively a liquid that is converted into a gas, allows the thermally decomposing of the precursor gas 107 (step 112) that grows or begins the growth of nano-wires 109 from the growth-inducing particles 101. In further embodiments, the nano-wire growth process 100 includes functionalizing or oxidizing.

In one embodiment, the introducing of the precursor gas 107 (step 110) begins with a first introducing of a first amount of a fluid (gas or liquid), for example, silane, to the chamber 105. The first amount of the fluid remains within the chamber 105 for a first period of time. The process continues with the thermal decomposing (step 112) of the first amount of the fluid during at least a portion of the first period of time. The process 100 then includes a second introducing of a second amount of the fluid to the chamber 105, the second amount of the fluid remaining within the chamber 105 for a second period of time. The process 100 continues the thermally decomposing (step 112) of the second amount of the fluid during at least a portion of the second period of time. In one embodiment, intermediate purges (for example, vacuum-induced or with an inert purge gas, such as nitrogen, argon, or helium) are also included.

Suitable numbers of such cycles include, but are not limited to, once, twice, three times, four times, five times, between two and twenty times, between two and ten times, between five and fifteen times, between five and ten times, between ten and twenty times, or any suitable combination, sub-combination, range, or sub-range therein, depending upon the desired thickness and/or other properties for the nano-wires 109. Suitable durations for one, more than one, or all cycles, are at least 10 minutes, at least 20 minutes, at least 30 minutes, at least 45 minutes, at least 1 hour, at least 2 hours, at least 3 hours, at least 4 hours, at least 5 hours, at least 7 hours, between 10 minutes and 1 hour, between 20 minutes and 45 minutes, between 4 and 10 hours, between 6 and 8 hours, or any suitable combination, sub-combination, range, or sub-range therein.

The nano-wires 109 are produced, for example, thereby providing features and properties unique to being produced through the process 100, according to the disclosure, which is a static process using the enclosed vessel contrasted to flowable chemical vapor deposition that has concurrent flow of a precursor into and out of a chamber. As used herein, the phrase "thermal chemical vapor deposition" refers to a reaction and/or decomposition of one or more gases, for example, in a starved reactor configuration, and is distinguishable from plasma-assisted chemical vapor deposition, radical-initiated chemical vapor deposition, catalyst-assisted chemical vapor deposition, sputtering, atomic layer deposition (which is limited to a monolayer molecular deposition per cycle in contrast being capable of more than one layer of molecular deposition), and/or epitaxial growth (for example, growth at greater than 700° C.). In one embodiment, the nano-wires 109 are on regions of the substrate 103 that are unable to be coated through line-of-sight techniques.

In one embodiment, in addition to or alternative to the trapping of the growth-inducing particles 101, one or more treatments enable the growth of the nano-wires 109. Suitable treatments include, but are not limited to, hydrofluoric acid and phosphoric acid. Other suitable treatments include a roughened and/or chemically heterogenous surface (having portions with greater amounts of iron and/or nickel, thereby producing iron-rich or nickel-rich regions).

In one embodiment, the nano-wires 109 are produced on all exposed surfaces. As used herein, the term "exposed," with regard to "exposed surfaces," refers to any surface that is in contact with gas during the process, and is not limited to line-of-site surfaces or surfaces proximal to line-of-site directions as are seen in flow-through chemical vapor deposition processes that do not have an enclosed vessel. As will be appreciated by those skilled in the art, the coated article 111 is capable of being incorporated into a larger component or system (not shown).

In one embodiment, the nano-wires 109 have a crystalline microstructure and are conformally-coated with a coating 113, such as an amorphous coating or a crystalline coating, to define the coated article 111. The overall morphology of the coated article 111 facilitates use in a variety of applications. In one embodiment, the coated article 111 is used in photovoltaics, as either the base substrate modified into a photovoltaics or by application of known photovoltaics upon the coated article 111, for example, by having n-type and/or p-type layers defining a photovoltaic cell. In a further embodiment, low reflectivity of the coated article 111 permits increased efficiency of the photovoltaics, for example, through a higher conversion rate of photons. Similarly, in one embodiment, the coated article 111 defines a battery or other energy-storing device.

In one embodiment, the substrate 103 forms a portion or all of a nano-wire-coated article 111. Suitable flowpath components capable of being produced into the nano-wire-coated article 111 include, but are not limited to, fittings (for example, unions, connectors, adaptors, other connections between two or more pieces of tubing, for example, capable of making a leak-free or substantially leak-free seal), compression fittings (including ferrules, such as, a front and back ferrule), tubing (for example, coiled tubing, tubing sections such as used to connect a sampling apparatus, pre-bent tubing, straight tubing, loose wound tubing, tightly bound tubing, and/or flexible tubing, whether consisting of the interior being treated or including the interior and the exterior being treated), valves (such as, gas sampling, liquid sampling, transfer, shut-off, or check valves, for example, including a rupture disc, stem, poppet, rotor, multi-position configuration, able to handle vacuum or pressure, a handle or stem for a knob, ball-stem features, ball valve features, check valve features, springs, multiple bodies, seals, needle valve features, packing washers, and/or stems), quick-connects, sample cylinders, regulators and/or flow-controllers (for example, including o-rings, seals, and/or diaphragms), injection ports (for example, for gas chromatographs), in-line filters (for example, having springs, sintered metal filters, mesh screens, and/or weldments), glass liners, gas chromatograph components, liquid chromatography components, components associated with vacuum systems and chambers, components associated with analytical systems, sample probes, control probes, downhole sampling containers, drilled and/or machined block components, manifolds, particles, powders, or a combination thereof.

Figure 2:
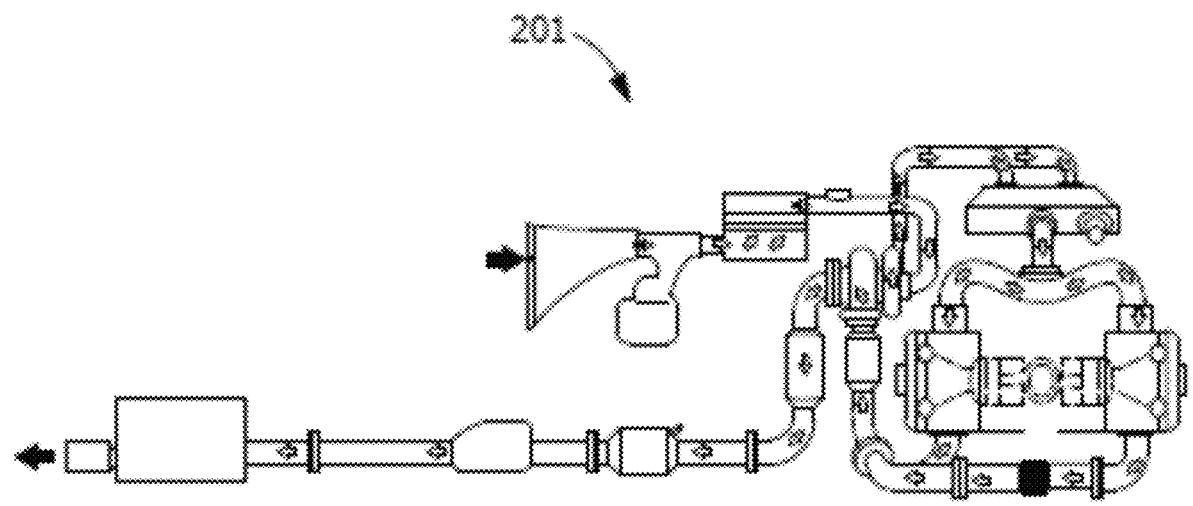
FIG. 2 is a schematic view showing a treated component within an intake and exhaust system, for example, of an automobile, according to an embodiment of the disclosure.
Figure 4:
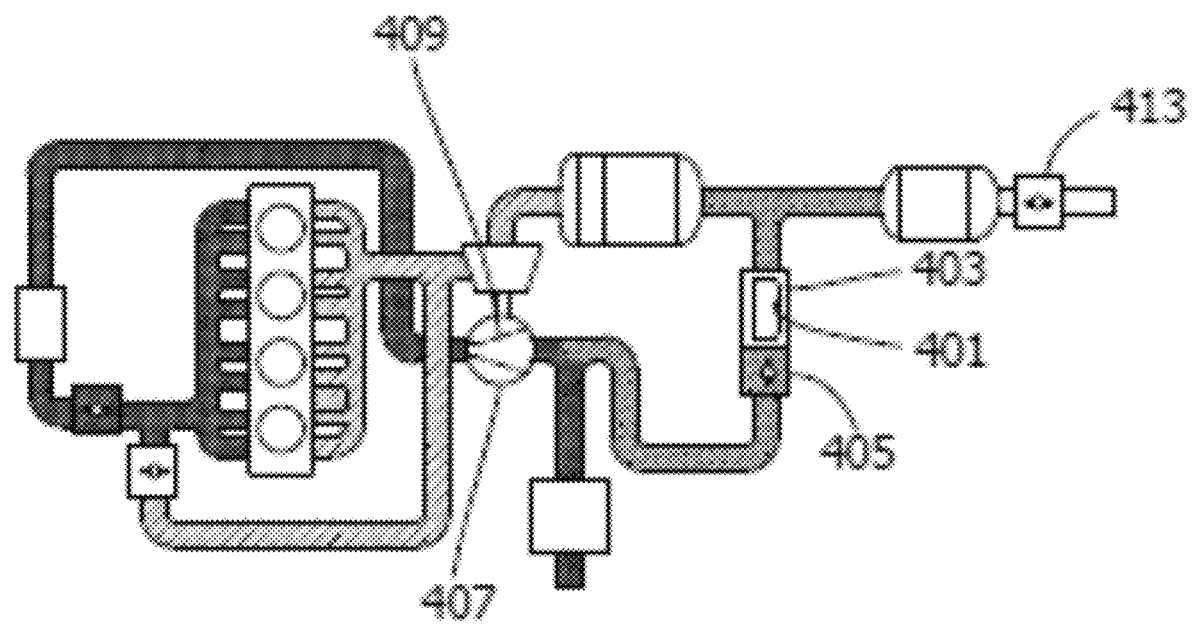
FIG. 4 is a schematic view showing treated components within an exhaust gas recirculation system, for example, of an automobile, according to embodiments of the disclosure.
Figure 5:
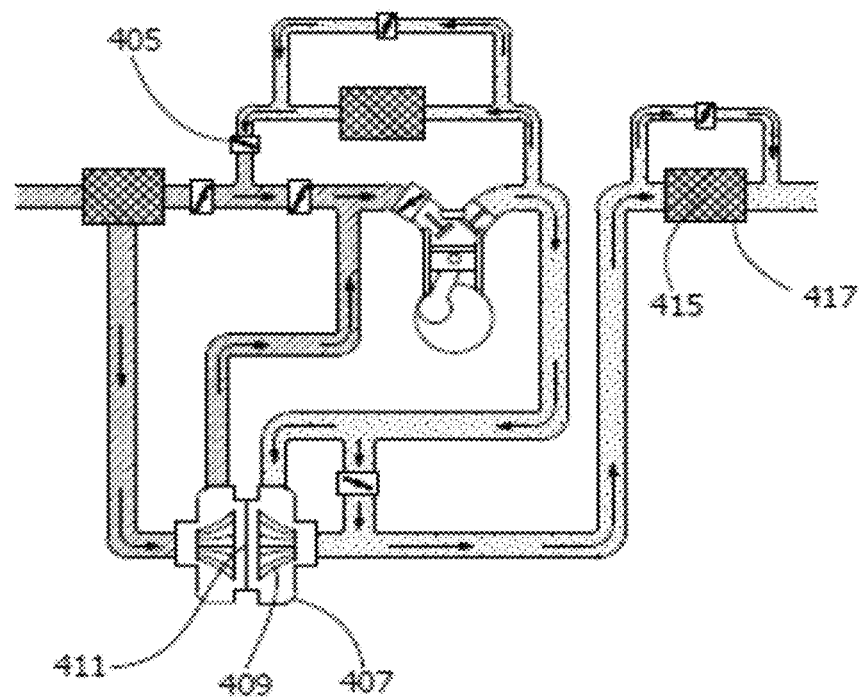
FIG. 5 is a schematic view showing treated components within an exhaust gas recirculation system, for example, of an automobile, according to embodiments of the disclosure.

Additionally or alternatively, in some embodiments, the nano-wire-coated article 111 is a surface or component within a system. In particular, the nano-wire-coated article 111 includes a flowpath article that has a surface that includes nano-wires that interact, either physically, chemically or otherwise with adjacent fluids (e.g., liquid, vapor or gas). For example, referring to FIG. 2, in one embodiment, the nano-wire-coated article 111 is an intake and/or exhaust system 201 for an internal combustion engine or a portion thereof, for example, configured to use gasoline (see FIG. 2) or diesel (see FIGS. 4-5). Referring to FIGS. 4 and 5, in one embodiment, the nano-wire-coated article 111 is an exhaust gas recirculation cooler block 401, the exhaust gas recirculation cooler block housing 403, the exhaust gas recirculation cooler valves 405, turbocharger housing 407, turbocharger compressor housing 409, turbocharger plates and components 411, exhaust valves 413, particulate filters 415, particulate filter housings 417, urea injection system and components, or other suitable portions thereof.

Figure 3:
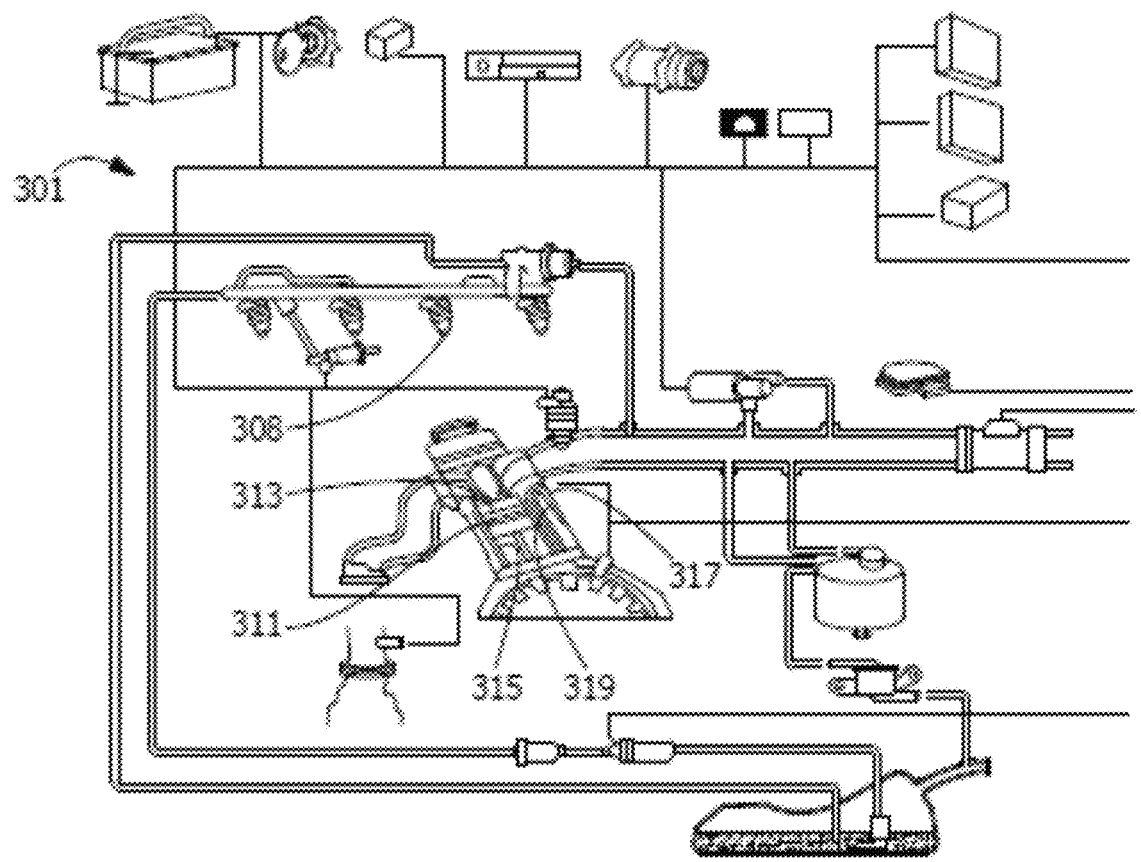
FIG. 3 is a schematic view showing a treated component within a fuel injection system, for example, of an automobile, according to an embodiment of the disclosure.

Referring to FIG. 3, in one embodiment, the nano-wire-coated article 111 is a surface or component within a fuel injection system 301, such as, fuel injector nozzles 308 (and, in some embodiments, fuel injector tips and/or fuel injector needles), pistons 311, piston heads 313, piston sleeves 315, fuel injection and exhaust valves 317, fuel injection and exhaust valve seats 319, and/or other suitable components.

Figure 6:
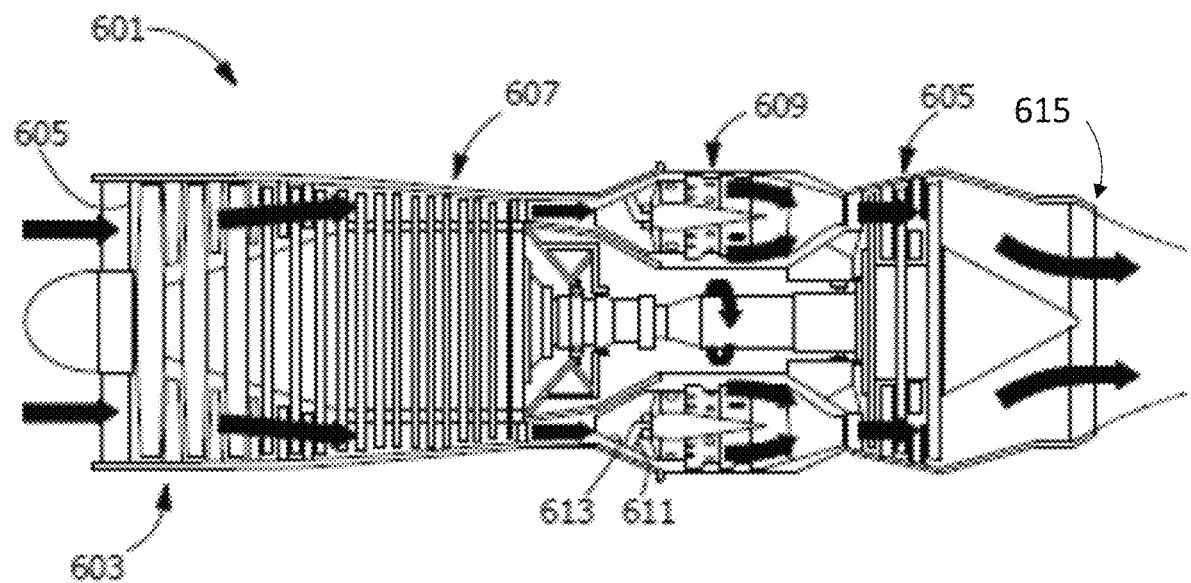
FIG. 6 is a schematic sectioned view showing a combustion system, for example, an engine of an airplane, according to an embodiment of the disclosure.

Referring to FIG. 6, in one embodiment, the substrate 103 is a combustion system 601 or a portion of the combustion system 601 (for example, an engine or a vehicle, such as, an airplane or automobile, or a power generation turbine). In further embodiments, the substrate 103 is positioned within an air intake region 603 (for example, at least partially defining an air inlet 605), a compression region 607, a combustion region 609 (for example, at least partially defining a combustion chamber 611, fuel supply paths 613, or other combustion-related features), a turbine region 605 (for example, at least partially defining components, such as, blades/buckets, air foils, fins, angel wings, shrouds, dovetails, and/or platforms), an exhaust region 615, and/or other suitable components (for example, valves, flaps, plates, chambers, tubing, and/or fittings).

Figure 7:
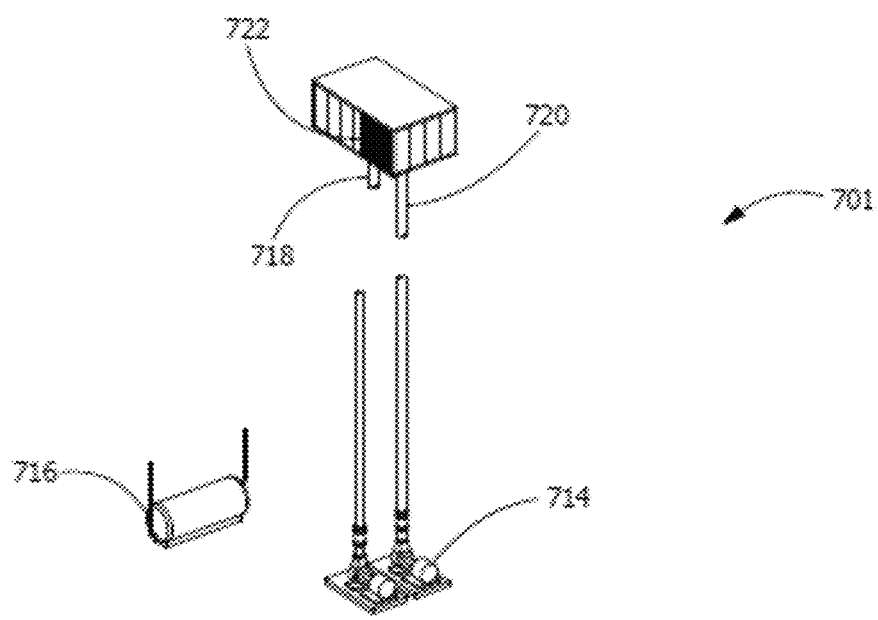
FIG. 7 is a schematic perspective view showing a treated component within a heating, ventilation, air conditioning, and refrigeration system (HVAC&R system), according to an embodiment of the disclosure.
Figure 8:
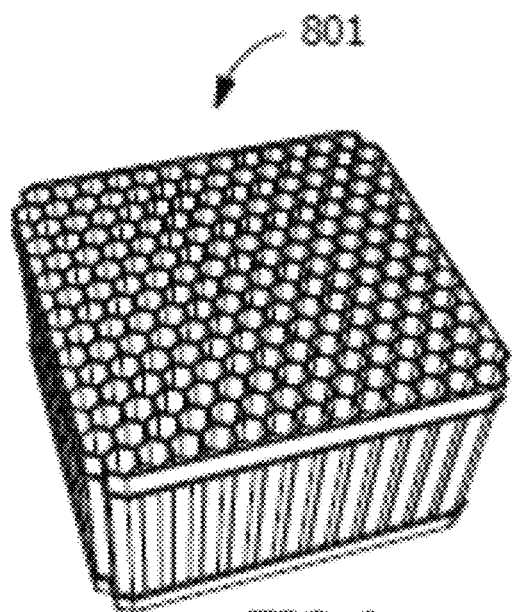
FIG. 8 is a perspective view showing a treated component with a honeycomb arrangement, for example, in a heat transfer system, according to an embodiment of the disclosure.
Figure 9:
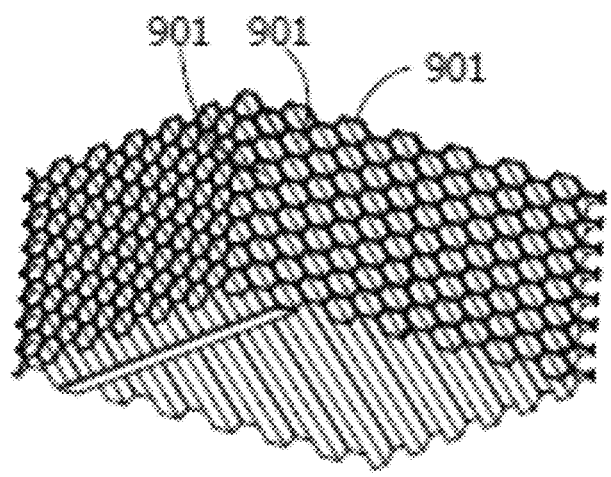
FIG. 9 is a perspective view showing a treated component with stacked plates, for example, in a heat transfer system, according to an embodiment of the disclosure.
Figure 10:
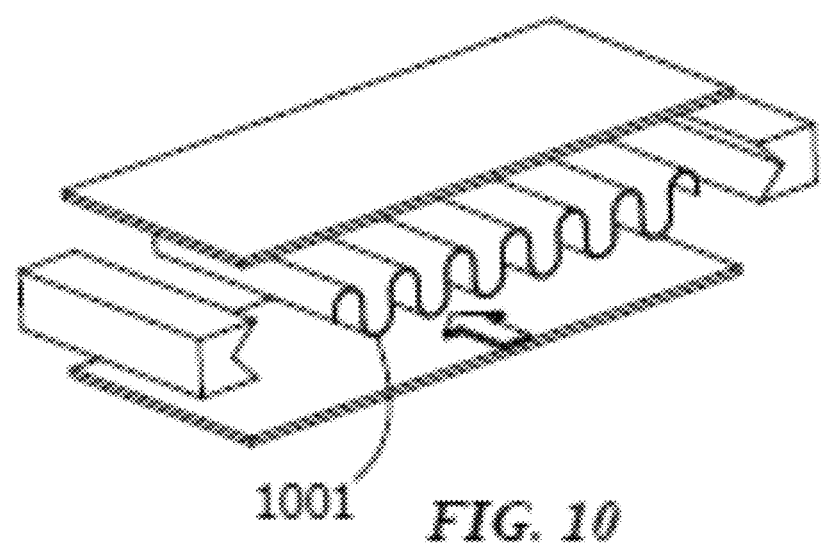
FIG. 10 is a perspective view showing a treated component with one or more fins, for example, in a heat transfer system, according to an embodiment of the disclosure.
Figure 11:
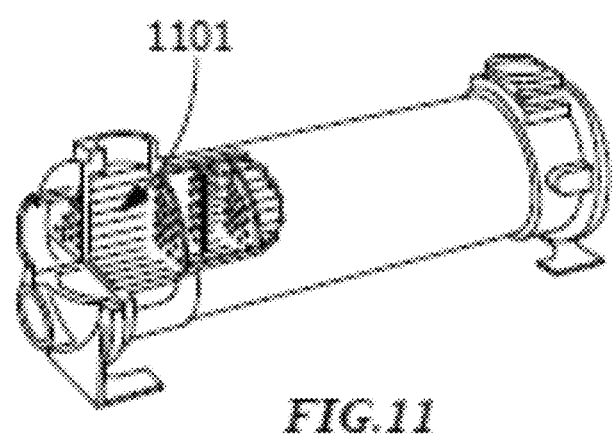
FIG. 11 is a perspective cutaway view showing a treated component with one or more tubes, for example, in a heat transfer system, according to an embodiment of the disclosure.

Referring to FIG. 7, in one embodiment, the substrate 103 is a heating, ventilation, air conditioning, and refrigeration system (HVAC&R system 701) or a portion of the HVAC&R system 701, such as, a vapor compression system 714, a boiler 716, an air return duct 718, an air supply duct 720, an air handler 722, heat exchange assemblies/components, or other suitable elements of the HVAC&R system 701.

Referring to FIGS. 8-11, in one embodiment, the substrate 103 is flowpath article in a heat transfer system or a portion of the heat transfer system, such as, a heat exchanger, a cooler, or a chiller. Specific embodiments of the heat transfer system include, but are not limited to, a honeycomb arrangement 801 (see FIG. 8), one or more stacked plates 901 (see FIG. 9), one or more of fins 1001 (see FIG. 10), or a tube bundle 1101 (see FIG. 11). In other embodiments, the honeycomb arrangement 801, the stacked plate(s) 901, the fin(s) 1001, and/or the tube bundle 1101 are a portion of a different system (not shown) or are stand-alone components for future assembly within the heat transfer system or the different system (not shown).

Additionally or alternatively, in one embodiment, the nano-wire-coated article 111 is a portion of an electrical device or component. In particular, the nano-wire-coated article 111 includes a portion of an article that provides a beneficial chemical or physical property to the electrical device. In certain embodiments, the nano-wire coated article 111 includes a portion of a lithium ion battery, thermoelectric device or sensor. For example, the nano-coated article 111 may be a lithium ion battery electrode, such as the cathode or anode of a battery. In other embodiments, the nano-wire-coated article may form a portion of a transistor, such as a MOSFETs (MOS field-effect transistors). In other embodiments, the nano-wire coated article 111 is a surface in a microelectronic device, chemical and/or biological sensors, energy scavenging devised, and solar energy conversion devices. In other embodiments, the nano-wire-coated article 111 includes piezoelectric devices. In other embodiments, the nano-wire-coated article 111 is a surface in a microelectronic device, such as, but not limited to, chemical and/or biological sensors, energy scavenging devised, and solar energy conversion devices.

Additionally or alternatively, in one embodiment, the nano-wire-coated article 111 is a portion of a photovoltaic device. For example, the coated article 111 is used as either the base substrate modified into a photovoltaic or by application of known photovoltaics upon the coated article 10, for example, by having n-type and/or p-type layers defining a photovoltaic cell.

In another embodiment, the nano-wire-coated article 111 is a tribological device or portion of a tribological device. In particular, the nano-wire-coated article 111 includes a portion of a device or component that provides a surface having beneficial tribological properties, such as desirable friction or other surface properties. For example, the nano-wire-coated article 111 may be utilized in automobile, aerospace, transportation, petrochemical, defense, medical and/or mining applications. For example, the nano-wire-coated article 111 may be a low friction surface, such as surfaces of bushings, bearings, brake components, gun barrels, rifle bolts or other friction surfaces benefiting from resilient low friction coatings. In other embodiments, the nano-wire-coated article 111 is a surface in boring equipment and/or earth-handling equipment, including downhole applications.

In other embodiments, the nano-wire-coated article 111 is a surface in medical devices, including catheters, needles, implants, implantable devices, stents, balloons or other medical device benefiting from a resilient low friction surface that is biocompatible.

The coating 113 includes properties through refinement of the process 100 based upon the specific end-use. Compared to coatings devoid of the nano-wires 109, suitable properties include increased corrosion/oxidation resistance, crystal-growth suppression, increased inertness, reduced metal ion transmission, increased surface area, increased contact angle (for example, by increasing a 70-80 degree water contact angle to above 100 degrees), and/or increased ability to be stripped (for example, with caustic solutions like NaOH by reducing the time necessary by 50%). In one embodiment, the coating 113 is hydrophobic and oleophilic, for example, allowing retention of lubricants but repulsion of water. Such embodiments are capable of use in bushings, rifle bolts, rotatable components, or other similar mechanical applications. In yet another embodiment, the coating 113 is capable of being used on a sponge or other highly porous material, thereby allowing oil to be collected and wiped off easily.

In one embodiment, the coating 113 is hydrophobic and oleophilic, for example, allowing retention of lubricants but repulsion of water. Such embodiments are capable of use in bushings, rifle bolts, rotatable components, or other similar mechanical applications.

In another embodiment, the nano-wires 109 are removed from the nano-wire-coated article 111. In this embodiment, the nano-wires 109 may be utilized as a bulk material having the desirable properties of the bulk nano-wire material. The nano-wires 109 may be removed by any suitable technique including, but not limited to, chemical or mechanical removal. For example, nano-wires 109 may be removed by application and subsequent removal of an adhesive tape or polymer coating, such as poly(methyl methacrylate), from the nano-wire-coated article 111. Alternatively, the nano-wires 109 may be mechanically scraped from the surface.

In one embodiment, the nano-wires 109 are formed by one or more of the following fluids: silane, silane and ethylene, silane and an oxidizer, dimethylsilane, dimethylsilane and an oxidizer, trimethylsilane, trimethylsilane and an oxidizer, dialkylsilyl dihydride, alkylsilyl trihydride, non-pyrophoric species (for example, dialkylsilyl dihydride and/or alkylsilyl trihydride), thermally-reacted material (for example, carbosilane and/or carboxysilane, such as, amorphous carbosilane and/or amorphous carboxysilane), species capable of a recombination of carbosilyl (disilyl or trisilyl fragments), methyltrimethoxysilane, methyltriethoxysilane, dimethyldimethoxysilane, dimethyldiethoxysilane, trimethylmethoxysilane, trimethylethoxysilane, ammonia, hydrazine, trisilylamine, Bis(tertiary-butylamino)silane, 1,2-bis(dimethylamino)tetramethyldisilane, dichlorosilane, hexachlorodisilane), organofluorotrialkoxysilane, organofluorosilylhydride, organofluoro silyl, fluorinated alkoxysilane, fluoroalkylsilane, fluorosilane, tridecafluoro 1,1,2,2-tetrahydrooctylsilane, (tridecafluoro-1,1,2,2-tetrahydrooctyl) triethoxysilane, triethoxy (3,3,4,4,5,5,6,6,7,7,8,8,8-tridecafluoro-1-octyl) silane, (perfluorohexylethyl) triethoxysilane, silane (3,3,4,4,5,5,6,6,7,7,8,8,9,9,10,10,10-heptadecafluorodecyl) trimethoxy-, or a combination thereof.

Suitable concentrations of thermally-reactive gas used in the process 100, by volume, are between 10% and 20%, between 10% and 15%, between 12% and 14%, between 10% and 100%, between 30% and 70%, between 50% and 80%, between 70% and 100%, between 80% and 90%, between 84% and 86%, or any suitable combination, sub-combination, range, or sub-range therein.

Suitable decomposition temperatures are greater than 370° C., greater than 380° C., greater than 390° C., greater than 400° C., greater than 410° C., greater than 420° C., greater than 430° C., greater than 440° C., greater than 450° C., greater than 500° C., between 380° C. and 450° C., between 400° C. and 500° C., or any suitable combination, sub-combination, range, or sub-range therein.

Suitable partial pressures are between 1 Torr and 10 Torr, 1 Torr and 5 Torr, 1 Torr and 3 Torr, 2 Torr and 3 Torr, 10 Torr and 150 Torr, between 10 Torr and 30 Torr, between 20 Torr and 40 Torr, between 30 Torr and 50 Torr, between 60 Torr and 80 Torr, between 50 Torr and 100 Torr, between 50 Torr and 250 Torr, between 100 Torr and 250 Torr, less than 250 Torr, less than 100 Torr, less than 50 Torr, less than 30 Torr, or any suitable combination, sub-combination, range, or sub-range therein.

The substrate 103 is any suitable material capable of withstanding the conditions of the process 100. In various embodiments, the substrate 103 is a metallic material that is tempered or non-tempered, has grain structures that are equiaxed, directionally-solidified, and/or single crystal, has amorphous or crystalline structures, is a foil, fiber, a cladding, and/or a film. Suitable metallic materials include, but are not limited to, ferrous-based alloys, non-ferrous-based alloys, nickel-based alloys, stainless steels (martensitic or austenitic), aluminum alloys, composite metals, or combinations thereof. In an alternative embodiment, the metallic material is replaced with a non-metallic material. Suitable non-metal or non-metallic materials include, but are not limited to, ceramics, glass, ceramic matrix composites, or a combination thereof.

In one embodiment, the metallic material has a first iron concentration and a first chromium concentration, the first iron concentration being greater than the first chromium concentration. For example, suitable values for the first iron concentration include, but are not limited to, by weight, greater than 50%, greater than 60%, greater than 66%, greater than 70%, between 66% and 74%, between 70% and 74%, or any suitable combination, sub-combination, range, or sub-range therein. Suitable values for the first chromium concentration include, but are not limited to, by weight, greater than 10.5%, greater than 14%, greater than 16%, greater than 18%, greater than 20%, between 14% and 17%, between 16% and 18%, between 18% and 20%, between 20% and 24%, or any suitable combination, sub-combination, range, or sub-range therein.

In one embodiment, the metallic material is or includes a composition, by weight, of up to 0.08% carbon, between 18% and 20% chromium, up to 2% manganese, between 8% and 10.5% nickel, up to 0.045% phosphorus, up to 0.03% sulfur, up to 1% silicon, and a balance of iron (for example, between 66% and 74% iron).

In one embodiment, the metallic material is or includes a composition, by weight, of up to 0.08% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the metallic material is or includes a composition, by weight, of up to 0.03% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the metallic material is or includes a composition, by weight, of between 14% and 17% chromium, between 6% and 10% iron, between 0.5% and 1.5% manganese, between 0.1% and 1% copper, between 0.1% and 1% silicon, between 0.01% and 0.2% carbon, between 0.001% and 0.2% sulfur, and a balance nickel (for example, 72%).

In one embodiment, the metallic material is or includes a composition, by weight, of between 20% and 24% chromium, between 1% and 5% iron, between 8% and 10% molybdenum, between 10% and 15% cobalt, between 0.1% and 1% manganese, between 0.1% and 1% copper, between 0.8% and 1.5% aluminum, between 0.1% and 1% titanium, between 0.1% and 1% silicon, between 0.01% and 0.2% carbon, between 0.001% and 0.2% sulfur, between 0.001% and 0.2% phosphorus, between 0.001% and 0.2% boron, and a balance nickel (for example, between 44.2% and 56%).

In one embodiment, the metallic material is or includes a composition, by weight, of between 20% and 23% chromium, between 4% and 6% iron, between 8% and 10% molybdenum, between 3% and 4.5% niobium, between 0.5% and 1.5% cobalt, between 0.1% and 1% manganese, between 0.1% and 1% aluminum, between 0.1% and 1% titanium, between 0.1% and 1% silicon, between 0.01% and 0.5% carbon, between 0.001% and 0.02% sulfur, between 0.001% and 0.02% phosphorus, and a balance nickel (for example, 58%).

In one embodiment, the metallic material is or includes a composition, by weight, of between 25% and 35% chromium, between 8% and 10% iron, between 0.2% and 0.5% manganese, between 0.005% and 0.02% copper, between 0.01% and 0.03% aluminum, between 0.3% and 0.4% silicon, between 0.005% and 0.03% carbon, between 0.001% and 0.005% sulfur, and a balance nickel (for example, 59.5%).

In one embodiment, the metallic material is or includes a composition, by weight, of between 17% and 21% chromium, between 2.8% and 3.3% iron, between 4.75% and 5.5% niobium, between 0.5% and 1.5% cobalt, between 0.1% and 0.5% manganese, between 0.2% and 0.8% copper, between 0.65% and 1.15% aluminum, between 0.2% and 0.4% titanium, between 0.3% and 0.4% silicon, between 0.01% and 1% carbon, between 0.001 and 0.02% sulfur, between 0.001 and 0.02% phosphorus, between 0.001 and 0.02% boron, and a balance nickel (for example, between 50% and 55%).

In one embodiment, the metallic material is or includes a composition, by weight, of between 2% and 3% cobalt, between 15% and 17% chromium, between 5% and 17% molybdenum, between 3% and 5% tungsten, between 4% and 6% iron, between 0.5% and 1% silicon, between 0.5% and 1.5% manganese, between 0.005 and 0.02% carbon, between 0.3% and 0.4% vanadium, and a balance nickel.

In one embodiment, the metallic material is or includes a composition, by weight, of up to 0.15% carbon, between 3.5% and 5.5% tungsten, between 4.5% and 7% iron, between 15.5% and 17.5% chromium, between 16% and 18% molybdenum, between 0.2% and 0.4% vanadium, up to 1% manganese, up to 1% sulfur, up to 1% silicon, up to 0.04% phosphorus, up to 0.03% sulfur, and a balance nickel.

In one embodiment, the metallic material is or includes a composition, by weight, of up to 2.5% cobalt, up to 22% chromium, up to 13% molybdenum, up to 3% tungsten, up to 3% iron, up to 0.08% silicon, up to 0.5% manganese, up to 0.01% carbon, up to 0.35% vanadium, and a balance nickel (for example, 56%).

In one embodiment, the metallic material is or includes a composition, by weight, of between 1% and 2% cobalt, between 20% and 22% chromium, between 8% and 10% molybdenum, between 0.1% and 1% tungsten, between 17% and 20% iron, between 0.1% and 1% silicon, between 0.1% and 1% manganese, between 0.05 and 0.2% carbon, and a balance nickel.

In one embodiment, the metallic material is or includes a composition, by weight, of between 0.01% and 0.05% boron, between 0.01% and 0.1% chromium, between 0.003% and 0.35% copper, between 0.005% and 0.03% gallium, between 0.006% and 0.8% iron, between 0.006% and 0.3% magnesium, between 0.02% and 1% silicon+iron, between 0.006% and 0.35% silicon, between 0.002% and 0.2% titanium, between 0.01% and 0.03% vanadium+titanium, between 0.005% and 0.05% vanadium, between 0.006% and 0.1% zinc, and a balance aluminum (for example, greater than 99%).

In one embodiment, the metallic material is or includes a composition, by weight, of between 0.05% and 0.4% chromium, between 0.03% and 0.9% copper, between 0.05% and 1% iron, between 0.05% and 1.5% magnesium, between 0.5% and 1.8% manganese, between 0.5% and 0.1% nickel, between 0.03% and 0.35% titanium, up to 0.5% vanadium, between 0.04% and 1.3% zinc, and a balance aluminum (for example, between 94.3% and 99.8%).

In one embodiment, the metallic material is or includes a composition, by weight, of between 0.0003% and 0.07% beryllium, between 0.02% and 2% bismuth, between 0.01% and 0.25% chromium, between 0.03% and 5% copper, between 0.09% and 5.4% iron, between 0.01% and 2% magnesium, between 0.03% and 1.5% manganese, between 0.15% and 2.2% nickel, between 0.6% and 21.5% silicon, between 0.005% and 0.2% titanium, between 0.05% and 10.7% zinc, and a balance aluminum (for example, between 70.7% to 98.7%).

In one embodiment, the metallic material is or includes a composition, by weight, of between 0.15% and 1.5% bismuth, between 0.003% and 0.06% boron, between 0.03% and 0.4% chromium, between 0.01% and 1.2% copper, between 0.12% and 0.5% chromium+manganese, between 0.04% and 1% iron, between 0.003% and 2% lead, between 0.2% and 3% magnesium, between 0.02% and 1.4% manganese, between 0.05% and 0.2% nickel, between 0.5% and 0.5% oxygen, between 0.2% and 1.8% silicon, up to 0.05% strontium, between 0.05% and 2% tin, between 0.01% and 0.25% titanium, between 0.05% and 0.3% vanadium, between 0.03% and 2.4% zinc, between 0.05% and 0.2% zirconium, between 0.150 and 0.2% zirconium+titanium, and a balance of aluminum (for example, between 91.7% and 99.6%).

In one embodiment, the metallic material is or includes a composition, by weight, of between 0.4% and 0.8% silicon, up to 0.7% iron, between 0.15% and 0.4% copper, up to 0.15% manganese, between 0.8% and 1.2% magnesium, between 0.04% and 0.35% chromium, up to 0.25% zinc, up to 0.15% titanium, optional incidental impurities (for example, at less than 0.05% each, totaling less than 0.15%), and a balance of aluminum (for example, between 95% and 98.6%).

In one embodiment, the metallic material is or includes a composition, by weight, of between 11% and 13% silicon, up to 0.6% impurities/residuals, and a balance of aluminum.

EXAMPLE

Consistent with an embodiment of the disclosure, nano-wires are grown on a 316 stainless steel substrate according to the disclosure, corresponding to thermal decomposition being at a temperature of 400° C. The Map Sum Spectrum through Energy-Dispersive X-Ray Spectroscopy (EDS) of the nano-wires on the 316 stainless steel substrate shows elemental composition, by weight, of 40.3% Fe, 26.5% Si, 11.3% Cr, 9.3% Ni, 9.2% C, 1.7%, O 1.3% Mo, and 0.3% Al.

According to a comparative example, nano-wires are not grown on a 316 stainless steel substrate corresponding to thermal decomposition being at a temperature of 370° C.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A nano-wire growth process, comprising:
trapping growth-inducing particles on a substrate;
positioning the substrate within a chamber;
closing the chamber;
applying a vacuum to the chamber;
introducing a precursor gas to the chamber;
thermally decomposing the precursor gas;
wherein the thermally decomposing of the precursor gas grows nano-wires from the growth-inducing particles;
wherein the substrate is stainless steel, 304 stainless steel, 316 stainless steel, or a combination thereof.

2. A nano-wire growth process, comprising:
trapping growth-inducing particles on a substrate;
positioning the substrate within a chamber;
closing the chamber;
applying a vacuum to the chamber;
introducing a precursor gas to the chamber;
thermally decomposing the precursor gas;
wherein the thermally decomposing of the precursor gas grows nano-wires from the growth-inducing particles;
wherein the substrate has a polished surface, a mirror-polished surface, an average Ra surface roughness value of less than 20 micro-inches, an average Ra surface roughness value of greater than 20 micro-inches, or a combination thereof.

3. A tribological component of a tribological device comprising nano-wires produced by a nano-wire growth process, the nano-wire growth process comprising:
trapping growth-inducing particles on a substrate;
positioning the substrate within a chamber;
closing the chamber;
applying a vacuum to the chamber;
introducing a precursor gas to the chamber;
thermally decomposing the precursor gas;
wherein the thermally decomposing of the precursor gas grows nano-wires from the growth-inducing particles;
wherein the tribological component is bushings, bearings, brake pads, gun barrels, rifle bolts, boring equipment, earth-handling equipment, medical devices or other tribological components having desirable surface properties.

* * * * *